(12) United States Patent
Galliano et al.

(10) Patent No.: US 9,941,429 B2
(45) Date of Patent: Apr. 10, 2018

(54) PHOTOVOLTAIC ELEMENT

(75) Inventors: Federico Galliano, Lausanne (CH);
Paul Velut, Renens (CH); Guillaume Cuvillier, Lausanne (CH); Julien Verrey, Ecublens (CH); Yves Leterrier, Lausanne (CH); Jan-Anders Manson, Chexbres (CH); Alexandre Closset, Ferreyres (CH); Diego Fischer, Neuchatel (CH)

(73) Assignee: VHF TECHNOLOGIES SA, Yverdon-les-Bains (CH)

( * ) Notice: Subject to any disclaimer, the term of this patent is extended or adjusted under 35 U.S.C. 154(b) by 559 days.

(21) Appl. No.: 13/997,363

(22) PCT Filed: Dec. 23, 2011

(86) PCT No.: PCT/EP2011/074001
§ 371 (c)(1),
(2), (4) Date: Jan. 15, 2014

(87) PCT Pub. No.: WO2012/085286
PCT Pub. Date: Jun. 28, 2012

(65) Prior Publication Data
US 2014/0144491 A1 May 29, 2014

(30) Foreign Application Priority Data
Dec. 23, 2010 (CH) ........................................ 2174/10

(51) Int. Cl.
*H01L 31/0352* (2006.01)
*H02S 20/23* (2014.01)
(Continued)

(52) U.S. Cl.
CPC ...... *H01L 31/0352* (2013.01); *B29C 37/0078* (2013.01); *B32B 3/28* (2013.01);
(Continued)

(58) Field of Classification Search
CPC .. H01L 31/0352; H01L 31/18; B29C 37/0078
(Continued)

(56) References Cited

U.S. PATENT DOCUMENTS 5,972,166 A * 10/1999 Helwig ................. B29C 63/044
162/109
6,311,436 B1 * 11/2001 Mimura ................. E04D 1/365
136/251
(Continued)

FOREIGN PATENT DOCUMENTS

DE 102009014348 A1 12/2009
JP 2002111036 A 4/2002
(Continued)

OTHER PUBLICATIONS

International Search Report for PCT/EP2011/074001 dated Nov. 22, 2012.

*Primary Examiner* — Tae-Sik Kang
(74) *Attorney, Agent, or Firm* — Pearne & Gordon LLP

(57) ABSTRACT

According to the present invention there is provided a photovoltaic element, comprising a photovoltaic laminate; a structural substrate; wherein the photovoltaic element further comprises a plurality of hairs which are arranged to improve adhesion between said photovoltaic laminate and said structural substrate. There is also provided an intermediate product which is used in the manufacture of such a photovoltaic element and a method of manufacturing such a photovoltaic element.

8 Claims, 7 Drawing Sheets

(51) Int. Cl.
- *H02S 20/25* (2014.01)
- *H01L 31/18* (2006.01)
- *B29C 37/00* (2006.01)
- *B32B 27/36* (2006.01)
- *B32B 5/02* (2006.01)
- *B32B 7/12* (2006.01)
- *B32B 27/04* (2006.01)
- *B32B 27/32* (2006.01)
- *B32B 27/38* (2006.01)
- *B32B 3/28* (2006.01)

(52) U.S. Cl.
CPC .............. *B32B 5/02* (2013.01); *B32B 7/12* (2013.01); *B32B 27/04* (2013.01); *B32B 27/32* (2013.01); *B32B 27/36* (2013.01); *B32B 27/38* (2013.01); *H01L 31/18* (2013.01); *H02S 20/23* (2014.12); *H02S 20/25* (2014.12); *B32B 2262/101* (2013.01); *B32B 2419/06* (2013.01); *B32B 2457/12* (2013.01); *Y02B 10/12* (2013.01)

(58) Field of Classification Search
USPC .......................................... 136/252; 438/57
See application file for complete search history.

(56) References Cited

U.S. PATENT DOCUMENTS

| | | |
|---|---|---|
| 2009/0133340 A1 | 5/2009 | Shiao |
| 2009/0133738 A1 | 5/2009 | Shiao |
| 2009/0178350 A1 | 7/2009 | Kalkanoglu |
| 2011/0155222 A1 | 6/2011 | Ehbing |

FOREIGN PATENT DOCUMENTS

| | | |
|---|---|---|
| WO | 2009108874 A2 | 9/2009 |
| WO | 2010095012 A2 | 8/2010 |

* cited by examiner

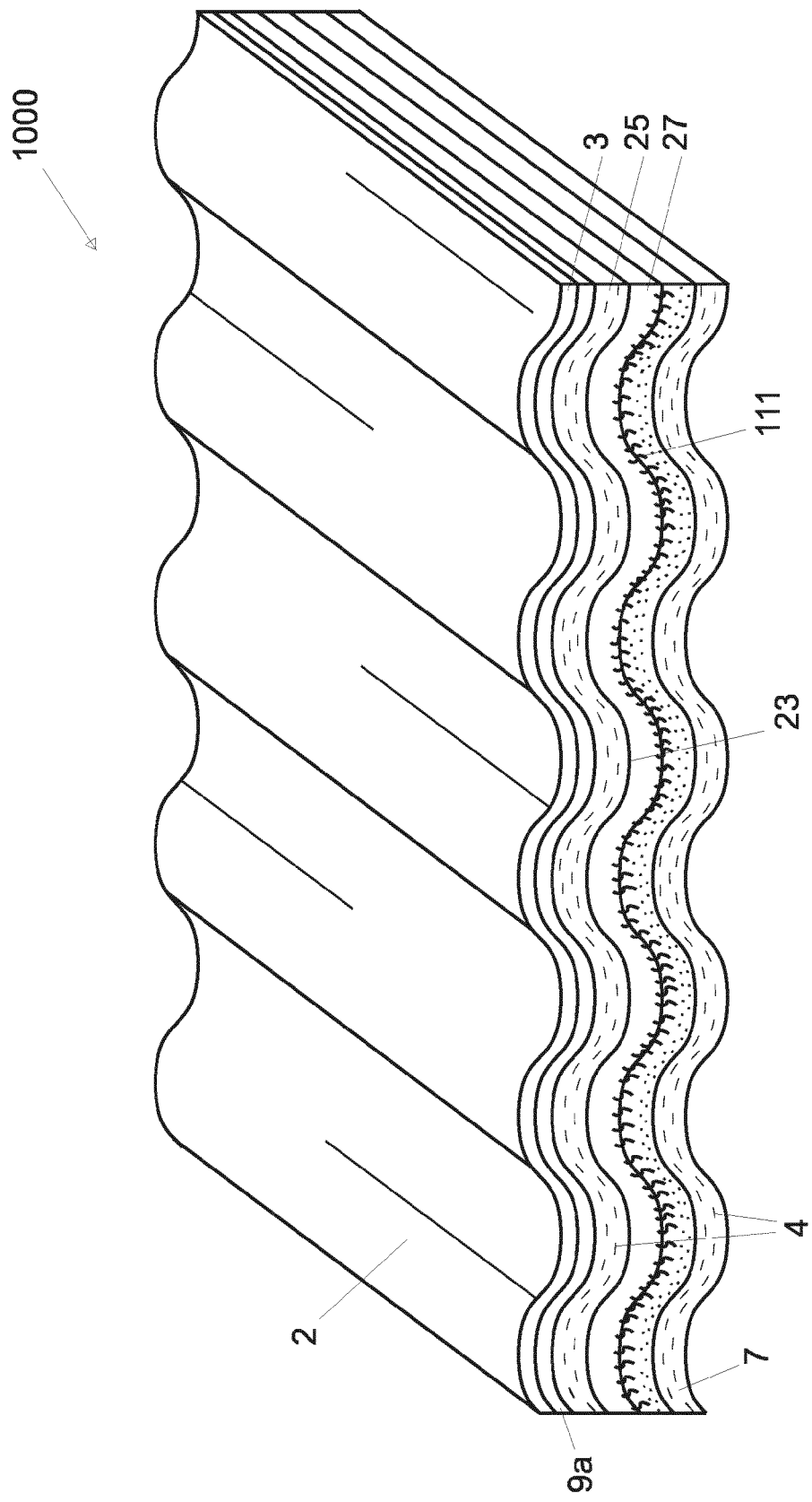

PHOTOVOLTAIC ELEMENT

FIELD OF THE INVENTION

The present invention relates to a photovoltaic element, in particular, but not exclusively, to a photovoltaic element which comprises a flexible photovoltaic module and is suitable for use in the building of structures.

DESCRIPTION OF RELATED ART

Photovoltaic building components with a laminar structure are already known and used for building roofs, walls or other parts of a building or vehicle. The building components, which are in use today usually have an active layer, such as a photovoltaic layer made up of amorphous, flexible silicon, deposited or layered on a back sheet, such as a flexible foil substrate of polyethylene TPO or another suitable plastic material, in order to provide a photovoltaic laminate. The use of a flexible active cell and flexible foil substrate is advantageous for adapting the surface of the photovoltaic laminate to any desired shape.

This flexible photovoltaic laminate is then laminated on a structural layer. The structural layer is usually a non-flexible layer of composite, concrete etc which is strong enough to serve as roof or wall element for a building (e.g. a house) or vehicle.

The flexible photovoltaic laminate is usually glued to the structural layer by means of adhesive. However, the flexible foil substrate is often smooth surfaced. Adhesive adheres to the smooth surface of the flexible photovoltaic laminate to secure the flexible photovoltaic laminate to the adjacent structural layer. Disadvantageously, the adhesion between the adhesive and the smooth surfaced flexible photovoltaic laminate is not robust enough to withstand the effects of weathering for long term. Consequently, after prolonged exposure to the weathering the layers become separated from one another and the building component is compromised. For example, roof structures may be built from a series of laminar cladding building components; after prolonged exposure to weathering, adhesion between the layers of a laminar cladding building component in the roof structure will fail; the layers of the laminar cladding building component will become removed from one another thereby causing the roof structure to leak. In the case where the laminar cladding comprises a photovoltaic cell, when the layers of the laminar cladding building component become removed from one another, will adversely affect the claddings ability to produce photovoltaic energy.

To prevent layers in building components from separating from one another, bolts, screws or fasteners are used during the manufacture of the building components. During manufacture of the building components, after the layers of the building components have been stacked, bolts, screws or fasteners are used to secure the layers together and prevent the layers from separating from one another. Disadvantageously, it is very time consuming to manufacture building components in this manner.

US2009/0178350 describes a roofing or siding product for use with photovoltaic element. The product includes a rigid substrate having a top surface with one or more receptor zones thereon, each receptor zone being adapted to receive conventional planar photovoltaic elements. The adaptation may comprise texturing the surface, or providing an adhesive on the surface for facilitating the adhesion of a photovoltaic module on the surface.

WO2010/095012 describes a photovoltaic module in which rigid, crystalline photovoltaic cells are incorporated in a resin structure reinforced with fibres. The resin can be reinforced with fibres. Although the process of fixing the photovoltaic cells to a fabric with a molded resin improves the adhesion of the cells, the reliability still depends on the ability of the resin to adhere on the backsheet of the photovoltaic cells.

DE102009014348 describes a solar module comprising a transparent adhesive layer in which interconnected solar cells are embedded. A transparent, UV stable, thin front layer is located above the adhesive layer. A supporting sandwich element comprising a nucleic layer and glass fibre layers bonded by means of polyurethane is located on the rear face. The fibre are used for reinforcing the supporting element. This document does not solve the problem of adhesion between the solar cells and the rigid substrate.

Existing building components are heavy and are usually susceptible to breakage.

It is an aim of the present invention to obviate or mitigate one or more of the aforementioned disadvantages.

BRIEF SUMMARY OF THE INVENTION

According to a first aspect of the present invention there is provided a photovoltaic element, comprising a flexible photovoltaic laminate; a structural substrate; wherein the flexible photovoltaic element further comprises a plurality of hairs as part of said laminate and which are arranged to improve adhesion between said photovoltaic laminate and said structural substrate.

Hairs are any fibrous components which are not used to provide structural strength to a substrate; the term "hairs" includes, but is not limited to, continuous fibres and non-woven fabrics which comprise continuous fibres. The hairs may comprise, for example, polymer, glass or cellulose fibres. The hair may comprise polymer fibers such as polyethylene or polypropylene or polyester fibres, or glass fibers, or any type of combination of polymer and glass, or other types of fibers including cellulose-based fibers. The hair structure may be based on non-woven fabrics, in the form of sheets or web structures bonded together by entangling fibres or filaments mechanically, thermally or chemically. The hairs may be stapled, stitched, spunlaid or spunbond, and meltblown. They may be in the form of either short or long or continuous fibres or filaments (with a length from 3 mm to continuous, preferably from 6 mm to continuous, and a diameter from 5 µm to 100 µm, preferably from 10 µm to 60 µm). The structure of the hairs may include randomly organized fibers and oriented fibers. The weight of the hair structure may be in the range 30 to 700 g/sqm, preferably 50 to 300 g/sqm. The thickness of the hair structure may be in the range 50 µm to 5 mm, preferably 50 µm to 1 mm. The hair structure may be made out of polymer fibres such as polypropylene, polyester (PET), polyamide, PVC and polyethylène, cellulose-based fibres or inorganic fibres such as glass fibres.

The provision of hairs at a surface of the photovoltaic laminate increases the surface contact area at the surface of the photovoltaic laminate which is available for adhesion. The hairs can extend into the structural substrate when the structural substrate is applied to the surface of the photovoltaic laminate in a molten state and/or when the structural substrate is applied to the hairs which are at/on the surface of the photovoltaic laminate in a molted state. After the molten structural substrate has hardened the hairs which are at/on the surface of the photovoltaic laminate will be embedded in the hardened structural substrate. The hairs embedded in the structural substrate help anchor the photovoltaic laminate to the structural substrate, so that improved adhesion between the photovoltaic laminate and structural substrate is achieved.

In the case where the photovoltaic laminate and structural substrate are secured together by means of adhesive; the hairs can extend into the adhesive when the adhesive is applied between the photovoltaic laminate and structural substrate. After the adhesive has hardened the hairs which are at the surface of the photovoltaic laminate will be embedded in the hardened adhesive. The hairs embedded in the hardened adhesive help anchor the photovoltaic laminate to the adhesive, thus improving the overall adhesion between the photovoltaic laminate and structural substrate.

Furthermore, the component of the present invention does not use a glass substrate and is therefore lighter than existing building components, and less susceptible to breakage. The component of the present invention can have any desired shaped; such shapes can be easily attained during manufacture.

The photovoltaic element may be a component for building. For example the photovoltaic element may be a building component. The photovoltaic element may be a component suitable for use in the building of structures, for example roofs. The photovoltaic element may be a roof component. The photovoltaic element may be a portable product.

The hairs may be arranged such that they are at an interface between the first substrate and the structural substrate.

The photovoltaic laminate may comprise a flexible active layer secured to a flexible back sheet.

The photovoltaic laminate may comprise said plurality of hairs. Preferably, a surface of said photovoltaic laminate comprises said plurality of hairs.

The hairs may be arranged such that they extend from the photovoltaic laminate. Preferably, the hairs are arranged so that they extend from a surface of the photovoltaic laminate and penetrate into an over-moulded structural substrate.

The photovoltaic laminate having hairs extending from a surface can be distributed as a semi-finished product. Although the product is still too flexible to be used as roofing or siding material, it can be used by producers of rigid roofing or siding elements, and put in a mould used for moulding plastic or composite roofing or siding elements incorporating said photovoltaic laminate.

The hairs may be integral to the photovoltaic laminate. The hairs may be made integral to the structural substrate by over-moulding, injecting, projecting or compressing the structural substrate onto the hairs; for example, projection with chopped strand mats, and/or a sheet moulding compound.

The photovoltaic element may further comprise at least one felt layer. The at least one felt layer may be made of felt or felt-like material. For the purpose of thus text, any material which comprises a plurality of hairs for facilitating adhesion between the flexible photovoltaic laminate and the structural substrate will be considered as a felt-like material; this includes not only felt, but also other materials such as fibrous materials, fleece, non-woven materials, non-woven fabrics etc.

The at least one felt layer may comprises said plurality of hairs which are arranged to improve adhesion between said photovoltaic laminate and said structural substrate.

At least one felt layer may be secured to the photovoltaic laminate. One felt layer may be secured to the photovoltaic laminate and a second felt layer may be secured to the structural substrate. The felt layer may be secured by adhesion.

The structural substrate may be over-moulded onto the hairy surface of the photovoltaic laminate. The structural substrate may be over-moulded onto said plurality of hairs, for example onto a felt layer integral with said photovoltaic laminate, to secure the structural substrate to the photovoltaic laminate.

The structural substrate may be directly secured to the felt layer. The structural substrate may be directly secured to the felt layer, by means of over-moulding said structural substrate onto the felt layer.

The hairs may have some or all of the following properties: The plurality of hairs may be unidirectional; may have random orientation and or may be stitched.

The properties of the hairs in the felt layer may be different on opposing sides of the felt layer or at different areas of an interface between the photovoltaic laminate and structural substrate. For example, the felt layer may comprise hairs on a side of the felt layer which is attached to the photovoltaic laminate which may be shorter than hairs on a side of the felt layer which is at an interface between the photovoltaic laminate and structural substrate.

The active layer of the photovoltaic laminate may comprise a photovoltaic module. The active layer is flexible. The active layer comprises a flexible photovoltaic module, for example flexible amorphous cells. Alternatively, the active layer may comprise crystalline Silicon (C-Si) cells. The crystalline cells may consist of thin c-Si wavers, for example a waver substrate of 200 microns or less, and provide some flexibility.

The active layer may further comprise a plurality of hairs. The plurality of hairs may extend from a surface of the active layer.

The photovoltaic element may further comprise one or more silicon wafers. The or each silicon wafer may be located within the active layer.

The photovoltaic element may be planar in its normal state, and made non-planar when a rigid substrate is over-moulded onto it. The rigid substrate may be corrugated. The rigid substrate, and the photovoltaic element fixed onto this rigid substrate, may comprise a non-planar profile. The rigid substrate may comprise a corrugated profile.

The non-planar profile of the photovoltaic element may be given by the mould in which the rigid substrate in over-moulded, over-injected, over-infused onto the flexible photovoltaic laminate. The flexible photovoltaic laminate may be vacuum-sucked against the walls of this mould during the over-moulding operation.

The photovoltaic element may further comprise adhesive. Adhesive may be interposed between layers of the photovoltaic laminate. Adhesive may be interposed between the photovoltaic laminate and structural substrate. The adhesive may be in the form of adhesive layers. Preferably, no adhesive is provided and the structural substrate is directly over-moulded onto the hairy surface of the photovoltaic element.

The photovoltaic laminate may extend over the whole surface of the structural substrate, which is entirely protected and covered by the photovoltaic laminate. The photovoltaic laminate may comprise photovoltaic cells over a backsheet. The backsheet may have the same size and the same shape than the structural substrate, which is entirely covered by the backsheet. The photovoltaic laminate may comprise photovoltaic cells covered by a transparent layer. The transparent layer may have the same size and the same shape than the structural substrate, which is entirely covered by the transparent layer.

The structural substrate may further comprise resin. The structural substrate may further reinforced with fibres. The fibres may be glass fibres. The photovoltaic laminate may further comprise resin. The resin may be thermoset resins, photoset resins, thermoplastic resins. The photovoltaic laminate may further comprise fibres. The fibers may comprise polymer, glass, cellulose. The structural substrate may be a composite comprising resin and fibres. The composite may comprise glass fibres in a resin. The resin or fibres may improve the structural strength of the structural substrate making the structural substrate more resistant to breakage. The resin may be thermoset resins, photoset resins, thermoplastic resins the fibers may comprise polymer, glass, cellulose.

Fibres of the substrate are distinguished from hairs in that the fibres provide structural strength to a substrate whereas the hairs are not used to provide structural strength. Furthermore, fibres are typically substantially arranged in a substrate so that they are substantially parallel with a surface of said substrate to provide that substrate with structural strength, whereas typically hairs are arranged such that they extend from a surface of a substrate, e.g. the hairs are typically extend substantially perpendicular to a surface of a substrate.

The photovoltaic laminate or the structural substrate may comprise plastic. Both the photovoltaic laminate and the structural substrate may comprise plastic. The photovoltaic laminate may comprise a polymer. For example the photovoltaic laminate may comprise Polyethylene, Polyethylene naphthalate and/or Polyethylene terephthalate. The structural substrate may comprise Polyethylene or epoxy. Both the photovoltaic laminate and the structural substrate may comprise Polyethylene.

The plurality of hairs may take any suitable, shape, aspect, design or formation. The plurality of hairs may varying in length, have hooked configurations, having looped configurations, have curved configurations, have straight configurations, have undulating configurations and/or may be orientated at varying angles, According to a further aspect of the present invention there is provided a roof element comprising any of the afore-mentioned photovoltaic elements.

According to a further aspect of the present invention there is provided a wall element comprising any of the afore-mentioned photovoltaic elements.

According to a further aspect of the present invention there is provided an element for use in the manufacture of a photovoltaic element, the element comprising, a photovoltaic laminate; wherein the photovoltaic laminate further comprises a plurality of hairs which are arranged so that improved adhesion between the photovoltaic laminate and a structural substrate can be achieved.

The hairs may be arranged to extend from a surface of the photovoltaic laminate.

The photovoltaic laminate may comprise said plurality of hairs.

The hairs may be integral to the photovoltaic laminate.

The component for use in the manufacture of an element for building may further comprise a felt layer. The felt layer may comprise said plurality of hairs. The felt layer may be secured to the photovoltaic laminate.

According to a further aspect of the present invention there is provided a roof component or roof element, comprising any one of the afore-mentioned photovoltaic elements.

According to a further aspect of the present invention there is provided a roof comprising any one of the afore-mentioned photovoltaic elements. The roof may comprise a plurality of any one of the afore-mentioned photovoltaic elements.

According to a further aspect of the present invention there is provided a method of manufacturing a photovoltaic element, comprising the steps of:

providing a plurality of hairs at a surface of a flexible photovoltaic laminate;

providing a structural substrate in a molten form on said plurality of hairs at the surface of the flexible photovoltaic laminate such that the hairs at said surface of the photovoltaic laminate co-operate with the molten structural substrate to provide improved adhesion between the photovoltaic laminate and structural substrate.

The step of providing a plurality of hairs at a surface of the photovoltaic laminate may comprise the step of integrating hairs into the photovoltaic laminate. The hairs may be integrated using any suitable method.

The method may comprise securing an active layer to a substrate to form a photovoltaic laminate.

The step of providing a plurality of hairs at a surface of the photovoltaic laminate may comprise the step of securing a felt layer which comprises a plurality of hairs to the surface of the photovoltaic laminate.

The method may further comprise the step of providing adhesive between the structural substrate and the photovoltaic laminate. The method may further comprise the step of providing adhesive between a surface of the structural substrate and said surface of the photovoltaic laminate.

The step of providing adhesive between a surface of the structural substrate and said surface of the photovoltaic laminate may be done by injecting adhesive between said surface of the structural substrate and said surface of the photovoltaic laminate.

The method may comprise the step of over-moulding the structural substrate onto a photovoltaic laminate with a non-planar profile. The method may comprise the step of providing over-moulding a structural substrate over the photovoltaic laminate with a corrugated profile and/or surface. Preferably, the method further comprises the step of positioning the photovoltaic laminate into a mould. Positioning the photovoltaic laminate into the mould may provide the photovoltaic laminate with a non-planar and/or corrugated profile.

The method may comprise the step of providing the structural substrate with a non-planar surface. The method may comprise the step of providing the structural substrate with a corrugated surface. The method may further comprise the step of over-moulding the photovoltaic laminate onto the structural substrate. The structural substrate may be positioned on a non planar mould, to provide the second substrate with a non-planar surface and/or non-planar profile. The structural substrate may be positioned on a non planar mould, to provide the second substrate with a corrugated surface and/or corrugated profile.

Preferably, the method comprises the step of over-moulding the structural substrate onto the photovoltaic laminate. The hairs may become embedded in the structural substrate onto the photovoltaic laminate when the structural substrate is over moulded onto the photovoltaic laminate. The photovoltaic laminate may comprise a planar profile which is made non planar during over-moulding. Preferably, the method comprises the step of over-moulding the structural substrate onto the surface of the photovoltaic laminate which has been provided with hairs, and over-moulded on a mould which comprises a non-planar surface. The structural substrate is preferably position on the non-planar surface of the mould. The structural substrate may be injected, projected and/or compressed onto the photovoltaic laminate; for example, projection with chopped strand mats, and/or sheet moulding compound.

In one embodiment, an adhesive may be injected between said non-planar, or corrugated, surface of the structural substrate and said surface of the photovoltaic laminate, such that the hairs co-operate with the adhesive to provide improved adhesion between the photovoltaic laminate and structural substrate.

The method may further comprise the step of incorporating fibres into the structural layer. The method may further comprise the step of incorporating fibres into the structural substrate during over-moulding of the structural substrate onto the photovoltaic laminate. Resin may used instead or in addition to fibres.

The method may further comprise the step of incorporating fibres into the photovoltaic laminate. The method may further comprise the step of incorporating resin into the photovoltaic laminate.

The active layer may comprise a photovoltaic module. The active layer may be flexible. The active layer may comprise a flexible photovoltaic module.

The step of securing a photovoltaic module layer and a back sheet together may be done by adhering said layers together using adhesive.

As addition to the hairs in or on the photovoltaic laminate layer, the plurality of hairs could also be provided on the structural layer and the first substrate layer could be applied to the hairs on the structural layer so that improved adhesion between the structural layer and photovoltaic laminate is achieved.

BRIEF DESCRIPTION OF THE DRAWINGS

The invention will be better understood with the aid of the description of an embodiment given by way of example only and illustrated by the figures, in which:

FIG. 4 provides a cross-section view of a photovoltaic element according to a further embodiment of the present invention;

DETAILED DESCRIPTION OF POSSIBLE EMBODIMENTS OF THE INVENTION

Figure 1:
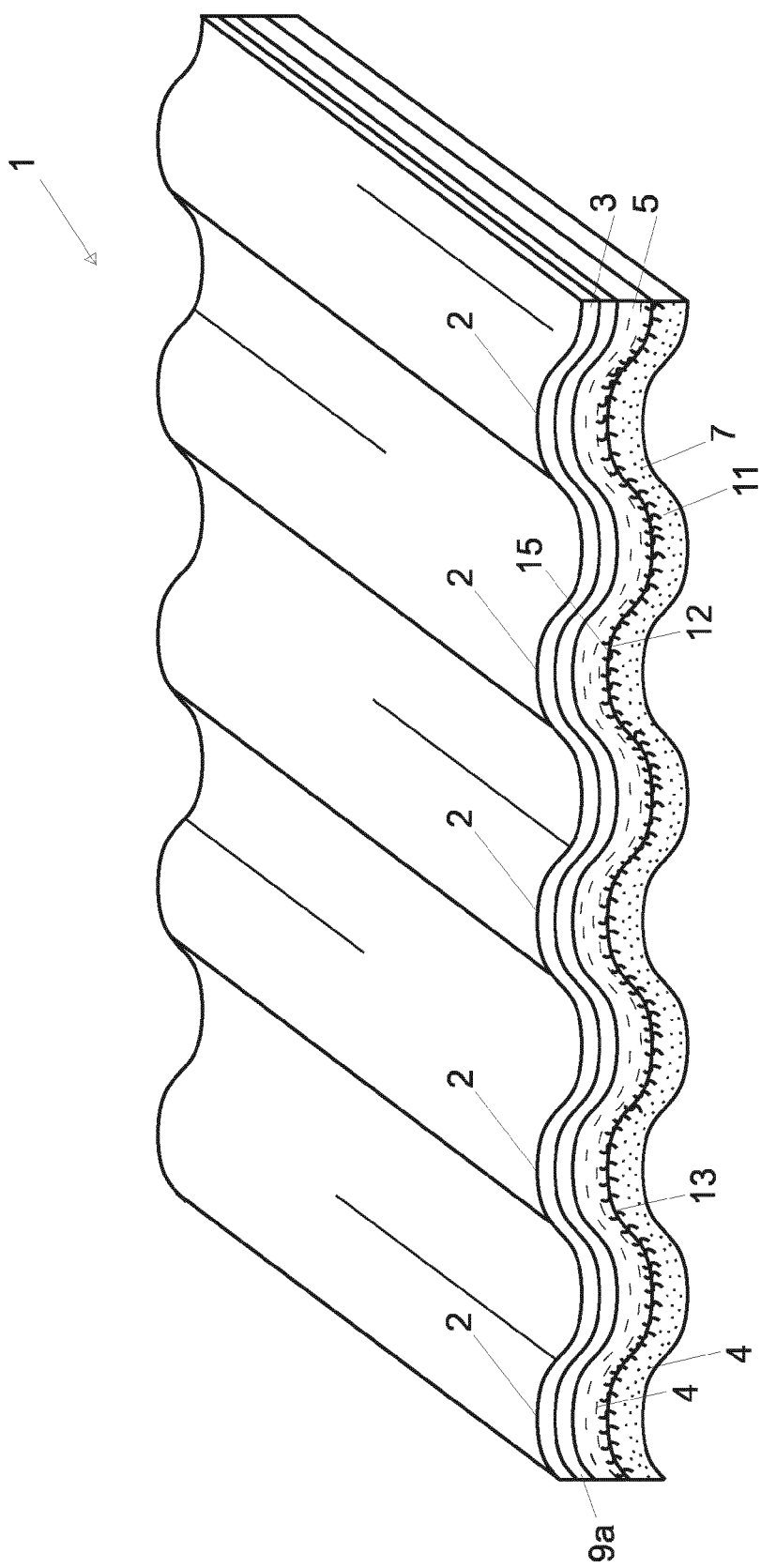
FIG. 1 provides a cross-section view of a photovoltaic element according to an embodiment of the present invention.

FIG. 1 provides a cross-section view of a photovoltaic element, in the form of a roof element 1, according to an embodiment of the present invention. The roof element 1 can be used to construct a roof or wall structure on for example a house, caravan, boat or on any other structure for that matter. Typically, a plurality of these roof elements 1 are co-operatively arranged to construct the roof or wall structure. The roof element 1 element is non-planar and has a corrugated profile defined by corrugations 2. The corrugations 2 in this particular example provide additional structural rigidity to the roof element 1.

The roof element 1 comprises an active layer in the form of a photovoltaic laminate 3, 5 secured to a structural substrate layer 7. The photovoltaic laminate is a semi-finished product and comprises in this example a laminate with a flexible photovoltaic module 3 and a first flexible substrate 5 (back sheet); and a structural substrate 7. The photovoltaic module layer 3 is secured to the flexible back sheet 5 by means of a first adhesive layer 9a, or by any other suitable means.

The lower face of the flexible photovoltaic laminate 3, 5 is secured to the structural substrate layer 7 by applying the structural substrate 7 in molten form to a surface 13 of the flexible photovoltaic laminate 3, 5 and subsequently allowing the structural substrate 7 to harden on the surface 13 of the photovoltaic laminate 3, 5. Thus, the structural substrate 7 is directly over-moulded onto the back sheet 5.

The structural substrate 7 and possibly the flexible back sheet 5 comprise fibres 4 (or resin) which provide structural support to said substrates 5,7. It should be understood that the substrates are not limited to having fibres 4 (or resin) and one or both of the substrates 5, 7 may comprise fibres 4 (or resin). The fibres 4 (or resin) will increases the strength of the substrates 5, 7 making them more resistant to breakage. The fibres 4 in the back sheet 5 of the photovoltaic laminate are shown to be arranged so they extend substantially parallel to the surface 13 of the back sheet. The fibres 4 in the structural substrate 7 are shown to be arranged so be arranged substantially parallel to the surface 15 of the structural substrate 7. However, it should be understood that the fibres may take any other suitable arrangement, for example the fibres may have a random orientation or they may be arranged as a mesh.

The flexible photovoltaic module 3 has a thickness within the range 0.2 to 2 mm. The thin structure of the flexible photovoltaic module 3 ensures that the flexible photovoltaic module 3 is very flexible. The flexible photovoltaic module 3 is however brittle and easy to tear.

The flexible back sheet 5 of the photovoltaic laminate provides structural support to the flexible photovoltaic module 3 so that the flexible photovoltaic module 3 cannot be easily torn. While being more rigid than the flexible photovoltaic module 3, the back sheet 5 is still flexible, thus when the flexible photovoltaic module 3 is secured to the back sheet 5 to form a stack, this stack remains flexible. The back sheet 5 in this particular example comprises Polyethylene or polypropylene; however it will be understood that the back sheet 5 could comprise any other suitable material, especially plastic material, or a laminate of different materials.

The structural substrate 7 provides structural support for the roof element 1 by supporting the photovoltaic laminate in the roof element 1. Being more rigid and robust than the flexible photovoltaic module 3 and the back sheet 5 which form the roof element 1, the structural substrate 7 makes that photovoltaic element 1 suitable for building a roof or wall for example. The structural substrate 7 in this particular example is made up of a composite of fibres, such as glass fibres, in a resin; however it will be understood that the structural substrate 7 could comprise any other suitable material. The structural substrate 7 is over-moulded onto the surface 13 of the back sheet 5 to secure the structural substrate 7 directly to the back sheet 5.

As shown in FIG. 1, the lower layer 5 of the photovoltaic laminate 3, 5 comprises a plurality of hairs 11 which are integral to the photovoltaic laminate 3, 5. The plurality of hairs may be made integral to the photovoltaic laminate 3, 5 using any suitable method; for example the hairs may be made integral to the photovoltaic laminate 3, 5 during the manufacture of the back sheet 5; for example the hairs 11 may be incorporated into the back sheet 5 of the photovoltaic laminate during manufacture when the back sheet 5 is in a molten state; or the hairs 11 may be glued to the back sheet 5. The photovoltaic laminate 3, 5 with the hair secured on it may be distributed as a semi-finished product.

At least some of the plurality of hairs 11 are arranged at an interface 12 between the photovoltaic laminate 3, 5 and the structural substrate 7. The hairs 11 are arranged to extend substantially perpendicularly from the surface 13 of the photovoltaic laminate 3, 5, into the structural substrate 7. The plurality of hairs 11 increase the surface contact area at the surface 13 of the photovoltaic laminate 3, 5 which is available for adhesion. The hairs 11 also extend into the structural substrate 7 to anchor the photovoltaic laminate 5 to the structural substrate 7. Thus, improved adhesion between the flexible photovoltaic laminate 3, 5 and structural substrate 7 is achieved. Ultimately, better adhesion between the flexible photovoltaic laminate 3, 5 and structural substrate 7 means that the photovoltaic laminate 3, 5 is less likely to become separated from the structural substrate 7, and consequently the photovoltaic laminate and the structural substrate 7 remain secured to one another even after having been subjected to the effects of weathering for long periods.

Figure 2:
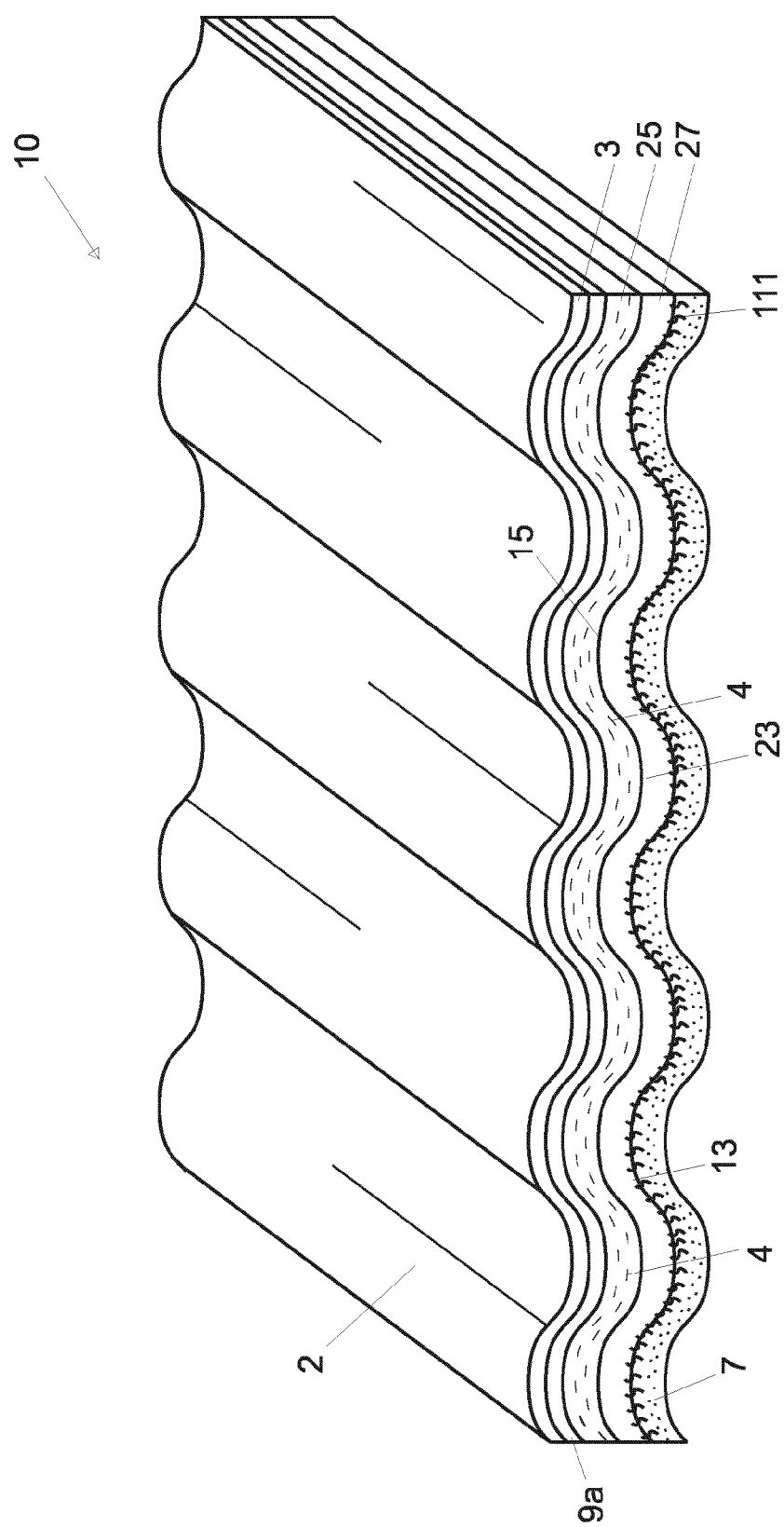
FIG. 2 provides a cross-section view of a photovoltaic element according to a further embodiment of the present invention.

FIG. 2 provides a cross-section view of a photovoltaic element in the form of a roof element 10, according to a second embodiment of the present invention. The roof element 10 has many of the same features as the roof element 1 shown in FIG. 1 and like features are awarded the same reference numerals.

The roof element 10 comprises a photovoltaic laminate with a back sheet 25. As was the case in the first embodiment, the photovoltaic laminate comprises a back sheet 25 that provides structural support to a flexible photovoltaic module 3 so that the flexible photovoltaic module 3 cannot be easily torn. While being more rigid than the flexible photovoltaic module 3, the back sheet 25 of the photovoltaic laminate is still flexible, thus when the photovoltaic module layer 3 secured to the back sheet 25 to form a stack, this stack of remains flexible. The back sheet 25 in this particular example comprises Polyethylene or polypropylene; however it will be understood that the back sheet 25 could comprise any suitable material, or laminate of different materials. Unlike the back sheet 5 of the roof element 1 shown in FIG. 1, the back sheet 25 in the embodiment shown in FIG. 2 does not comprise hairs integral to the back sheet 25.

The roof element 10 further comprises a layer 27 which is secured to a surface 23 of the photovoltaic laminate 3, 25. The layer 27 may comprise felt or felt-like material, such as felt, fibrous materials, fleece, non-woven materials, non-woven fabrics, etc. We will simply refer to this layer as a felt layer or felt-like layer without distinction. The felt layer 27 may be secured to the surface 23 using any suitable means (e.g. adhesive). The structural substrate 7 is over-moulded onto the felt layer 27 to directly secure the structural substrate 7 to the felt layer 27.

The felt layer 27 comprises a plurality of hairs 111. The hairs act in the same manner as described for the embodiment shown in FIG. 1; namely the plurality of hairs 111 increase the surface contact area at the surface 13 of the photovoltaic laminate which is available for adhesion, and the plurality of hairs 111 will also extend into the structural substrate 7 to anchor the photovoltaic laminate to the structural substrate 7. Thus, improved adhesion between the photovoltaic laminate and structural substrate 7 is achieved. Ultimately, improved adhesion between the photovoltaic laminate 3, 25 and structural substrate 7 means that the flexible photovoltaic laminate 3, 25 is less likely to become separated from the structural substrate 7; accordingly, the flexible photovoltaic laminate 3, and the structural substrate 7 remain secured to one another even after having been subjected to the effects of weathering for a prolonged period.

As described above the hairs are provided on the photovoltaic laminate. It will be understood that, in all embodiments, the hairs could alternatively or additionally be provided on the structural layer. In this case the photovoltaic laminate could be over-moulded or calandered onto the structural substrate.

Figure 3:
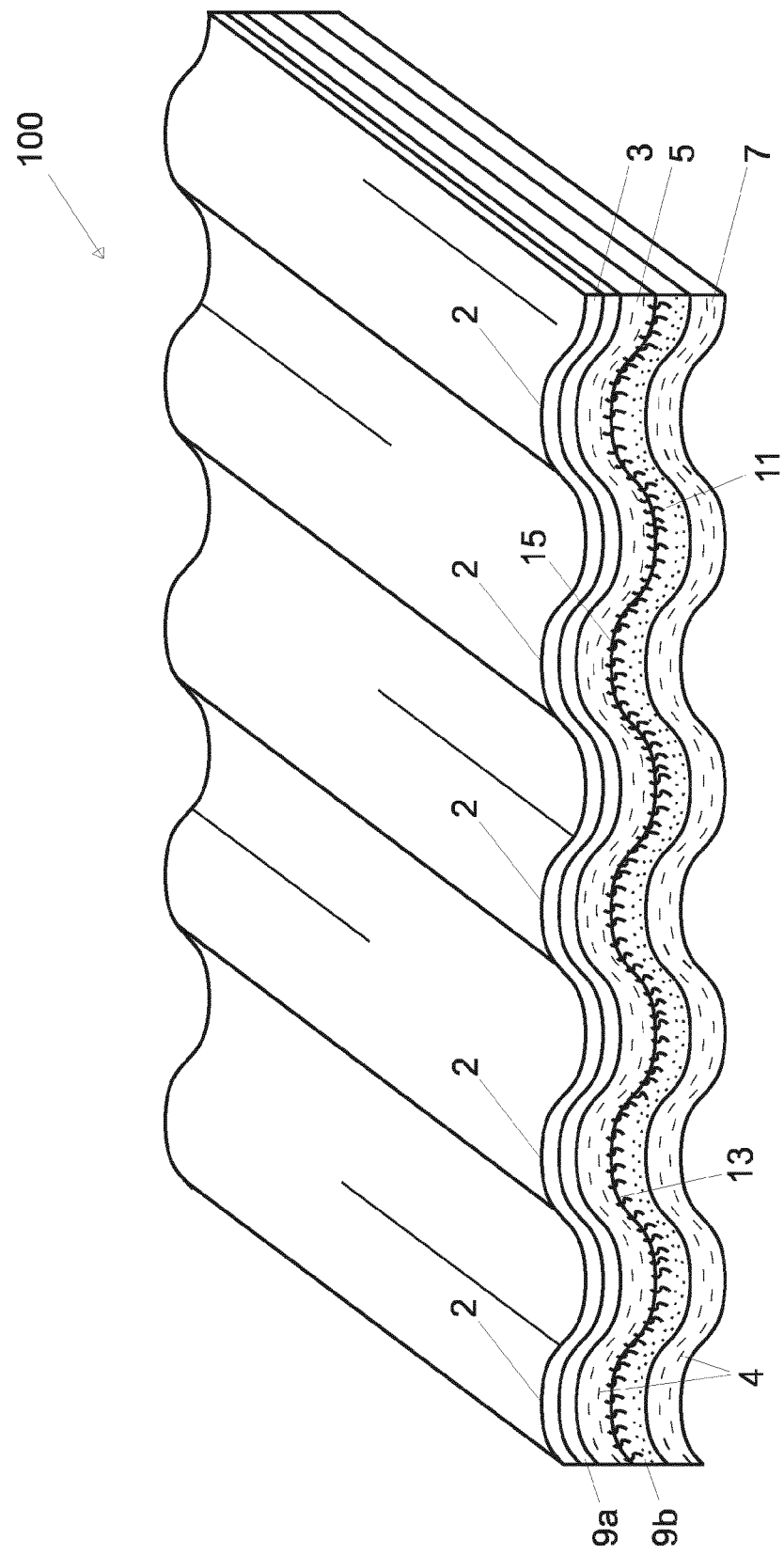
FIG. 3 provides a cross-section view of a photovoltaic element according to a further embodiment of the present invention.

FIG. 3 provides a cross-section view of a photovoltaic element in the form of a roof element 100, according to a further embodiment of the present invention. The embodiment shown in FIG. 3 has many of the same features as the embodiment shown in FIG. 1, and like features are awarded the same reference numerals.

Unlike the embodiment shown in FIG. 1 the structural substrate 7 is not directly secured to the flexible photovoltaic laminate 5, rather the structural substrate 7 is secured to the flexible photovoltaic laminate 5 by means of a second adhesive layer 9b.

The hairs 11 act in a similar advantageous manner to improve the adhesion between the flexible photovoltaic laminate 5 and the structural substrate 7; namely, the plurality of hairs 11 increase the surface contact area at the surface 13 of the flexible photovoltaic laminate 5 which is available for adhesion. At least some of the plurality of hairs 11 extend substantially perpendicularly from a surface 13 of the flexible photovoltaic laminate 5, and into the second adhesive layer 9b. The hairs 11 anchor the flexible photovoltaic laminate 5 to the second adhesive layer 9b. Thus, improved adhesion between the flexible photovoltaic laminate 5 and second adhesive layer 9b is achieved. Ultimately, better adhesion between the flexible photovoltaic laminate 5 and second adhesive layer 9b means that the flexible photovoltaic laminate 5 is less likely to become separated from the structural substrate 7, and consequently the flexible photovoltaic laminate 5 and structural substrate 7, remain secured to one another even after having been subjected to the effects of weathering for long periods.

Referring to FIGS. 1-3 it should be understood that additionally, the structural substrate 7 may also comprise a plurality of hairs. The hairs may extend perpendicularly from a surface 15 of the structural substrate 7 into the optional second adhesive layer 9b or directly into the flexible photovoltaic laminate 3, 5. The plurality of hairs will increase the surface contact area at the surface 15 of the structural substrate 7 which is available for adhesion and the hairs will also extend into the adhesive layer 9b or into the flexible photovoltaic laminate 3, 5 to anchor the structural substrate 7 to the second adhesive layer 9b or to the flexible photovoltaic laminate 5. Thus, improved adhesion between the structural substrate 7 and flexible photovoltaic laminate 3, 5 can be achieved. This will further strengthen the adhesion between the photovoltaic laminate 3, 5 and the structural substrate 7 so that they less likely to become separated.

FIG. 4 provides a cross-section view of a photovoltaic element in the form of a roof element 1000, according to a further embodiment of the present invention. The embodiment shown in FIG. 4 has many of the same features as the embodiment shown in FIG. 2, and like features are awarded the same reference numerals.

Unlike the embodiment shown in FIG. 2 the structural substrate 7 is not directly secured to the felt layer 27, rather the structural substrate 7 is secured to the felt layer 27 by means of a second adhesive layer 9b.

The hairs 111 in the felt layer 27 act in a similar advantageous manner to improve the adhesion between the flexible photovoltaic laminate 3, 5 and the structural substrate 7; namely, the plurality of hairs 111 increase the surface contact area at the surface 23 of the flexible photovoltaic laminate 3, 5 which is available for adhesion, and the plurality of hairs 111 will also extend into the adhesive layer 9b to anchor the flexible photovoltaic laminate 3, 25 to the second adhesive layer 9b. Thus, improved adhesion between the flexible photovoltaic laminate 3, 25 and second adhesive layer 9b can be achieved. Ultimately, improved adhesion between the flexible photovoltaic laminate 3, 25 and second adhesive layer 9b means that the flexible photovoltaic laminate 3, 25 is less likely to become separated from the structural substrate 7. Accordingly, the flexible photovoltaic laminate 3, 25 and structural substrate 7 remain secured to one another even after having been subjected to the effects of weathering for a prolonged period.

It should be understood that additionally the structural substrate 7 may also comprise a felt layer 27 which has a plurality of hairs which extend perpendicularly from a surface 15 of the structural substrate 7 into the second adhesive layer 9b or directly into the flexible photovoltaic laminate 3, 5. The plurality of hairs will increase the surface contact area at the surface 15 of the structural substrate 7 which is available for adhesion and the hairs will also extend into the adhesive layer 9b or into the flexible photovoltaic laminate 3, 5 to anchor the structural substrate 7 to the second adhesive layer 9b or to the flexible photovoltaic laminate 3, 5. Thus improved adhesion between the structural substrate 7 and flexible photovoltaic laminate 3, 5 can be achieved.

Figure 5A:
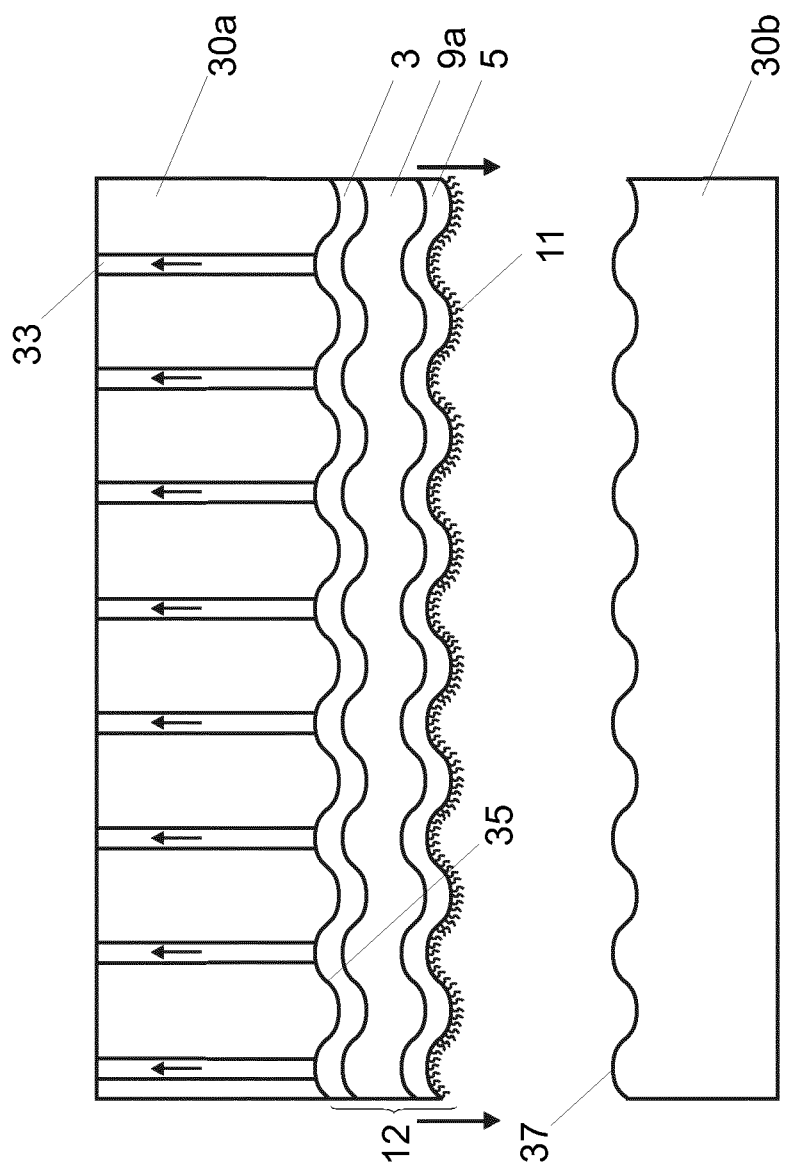
FIGS. 5a-b illustrate the steps involved in the manufacture of the photovoltaic element shown in FIG. 1.
Figure 5B:
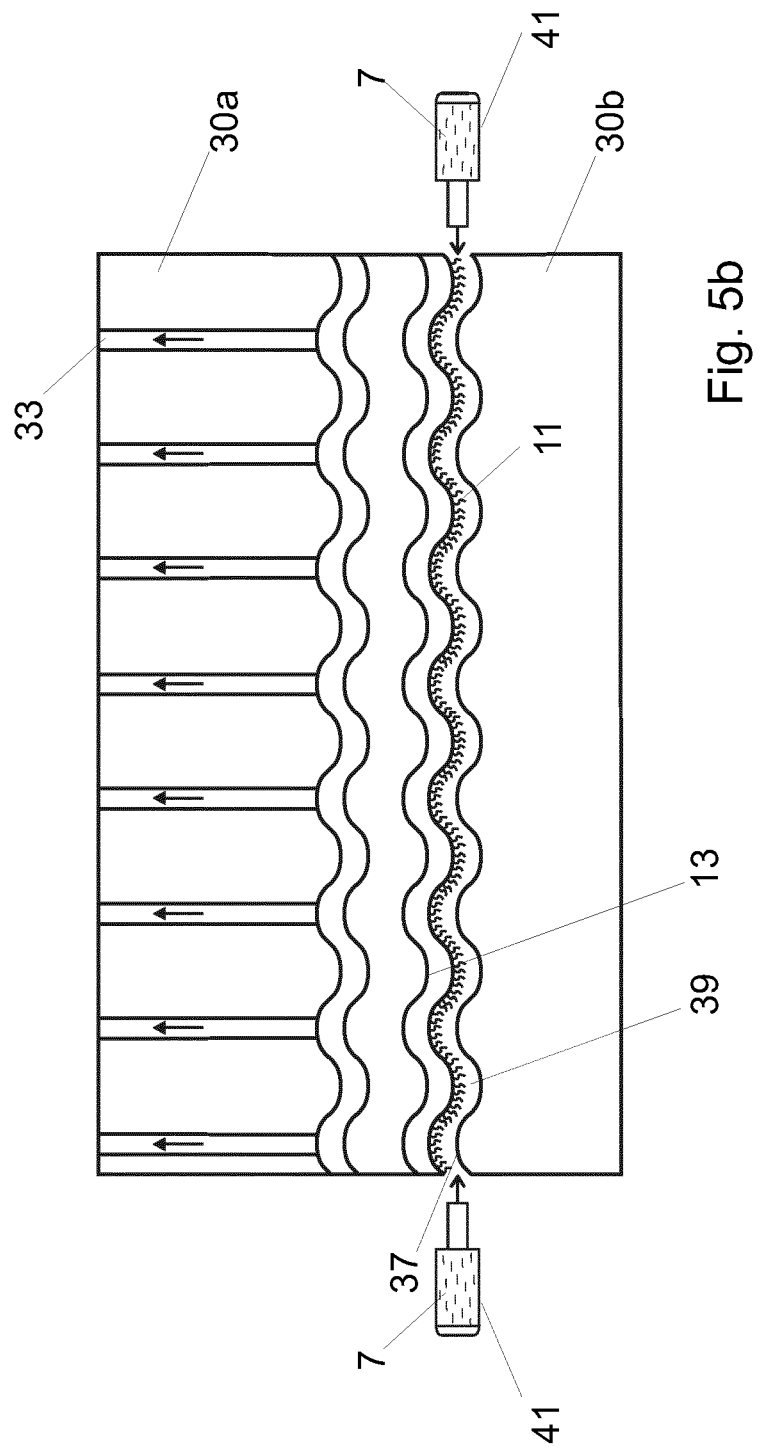

FIGS. 5a-b illustrate the steps involved in the manufacture of the roof element 1 shown in FIG. 1. The method first involves preparation of a photovoltaic laminate comprising in this example a flexible photovoltaic module 3 and a back sheet 5; using known methods.

A plurality of hairs 11 are made integral to the back sheet 5 of the photovoltaic laminate such that that they extend from a surface 13 of the back sheet 5; this can be done using any suitable method; for example the hairs 11 may be incorporated into the surface 13 of the flexible photovoltaic laminate 3, 5 during the manufacture of the flexible photovoltaic laminate 3, 5, for example during manufacture of the lowest layer of the photovoltaic laminate; for example the hairs 11 may be incorporated into the surface 13 of the back sheet 5 when the back sheet 5 is in a molten state during manufacture; or the hairs 11 may be simply glued to the surface 13 of the flexible photovoltaic laminate 3,5.

When manufacturing the roof element 10 as shown in FIG. 2, instead of providing a plurality of hairs integral to the flexible photovoltaic laminate, a felt layer 27 comprising a plurality of hairs, is simply secured to the surface 13 of the flexible photovoltaic laminate 5.

Next the flexible photovoltaic module 3 is secured to the back sheet 5 by means of an adhesive 9a to form a stack 12, i.e., the photovoltaic laminate. Due to the flexible nature of the flexible photovoltaic module 3 and back sheet 5, the stack or photovoltaic laminate 12 will be flexible. The flexible photovoltaic laminate 12 is then applied against a corrugated surface 35 of a first mould element 30a. The photovoltaic laminate 12 may be pressed or vacuum-sucked into the first mould element 30a against the corrugated surface 35, causing the photovoltaic laminate 12 to contour to the corrugated profile of the corrugated surface 35.

A vacuum is applied though channels 33 defined in the first corrugated die element 30a; the vacuum sucks on the photovoltaic laminate 12 so that the photovoltaic laminate 12 does not become removed from the surface 35 of the first mould element 30a.

The structural substrate 7 is prepared in a molten state using known methods. Optionally, resins and/or fibres 4 (as shown in FIG. 5b) may be incorporated into the structural substrate 7 when preparing it; when incorporated into the structural substrate 7, the resins or fibres 4 will provide structural support to the structural substrate 7.

The photovoltaic laminate 12 is then moved towards a surface 37 of a second mould element 30b. The second mould element 30b also comprises a corrugated surface 37, as shown in FIG. 5a. The photovoltaic laminate 12 is positioned such that the corrugations on the stack 12 correspond to the corrugations in corrugated surface 37 of the second mould element 30b (i.e. peaks in the corrugations in the photovoltaic laminate 12 overlay troughs in the corrugations in on corrugated surface 37 of the second mould element 30b).

As shown in FIG. 5b, the photovoltaic laminate 12 is held in a position above the corrugated surface 37 of the second mould element 30b, so that a channel 39 is defined by the corrugated surface 37 of the second mould element 30b and the surface 13 of the back sheet 5.

The structural substrate 7 in its molten state is then injected into the channel 39, using injecting means 41, until the channel 39 is full of molten structural substrate 7. In this way the structural substrate 7 is over-moulded onto the surface 13 of the back sheet 5. The corrugated surface 37 of the second mould element 30b, and the corrugated profile of the photovoltaic laminate 12, will force the injected molten structural substrate 7 attain a corrugated profile.

The plurality of hairs 11 increase the surface contact area at the surface 13 of the back sheet 5 which is available for adhesion with the molten structural substrate 7. Furthermore, as the molten structural substrate 7 moves into the channel 39, at least some of the plurality of hairs 11 which extend from the surface 13 of the back sheet 5, will become embedded in the molten structural substrate 7.

The molten structural substrate 7 is then allowed to harden. Once the molten structural substrate 7 has hardened the embedded hairs 11 will anchor the flexible photovoltaic laminate 3, 5 to the hardened structural substrate 7. Accordingly, improved adhesion between the flexible photovoltaic laminate 3, 5 and the structural substrate 7 is achieved. Ultimately, improved adhesion between the back sheet 5 and the structural substrate 7 means that the flexible photovoltaic laminate 3, 5 is less likely to become separated from the structural substrate 7, and the layers remain secured to one another even after having been subjected to the effects of weathering for a prolonged period.

Similar steps are used to prepare the embodiments shown in FIGS. 3 and 4. In this case the structural substrate 7 is prepared independently and allowed to harden. The photovoltaic laminate 12 is then positioned above the hardened structural substrate 7 to define a channel between the photovoltaic laminate and structural substrate 7. Adhesive is then injected into the channel, using injecting means, until the channel is full of adhesive. As was the case in the method describe above, the plurality of hairs increase the surface contact area at the surface 13 of the flexible photovoltaic laminate 3, 5 which is available for adhesion. Furthermore, as the adhesive moves into the channel, the plurality of hairs will become embedded in the adhesive to anchor the flexible photovoltaic laminate 3, 5 in the injected adhesive. Accordingly, improved adhesion between the flexible photovoltaic laminate 3, 5 and the injected adhesive is achieved; improved adhesion between the flexible photovoltaic laminate 3, 5 and the injected adhesive means that the flexible photovoltaic laminate 3,5 is less likely to become separated from the structural substrate 7, and the flexible photovoltaic laminate 3, 5 and structural substrate 7 remain secured to one another even after having been subjected to the effects of weathering for a prolonged period.

Figure 6:
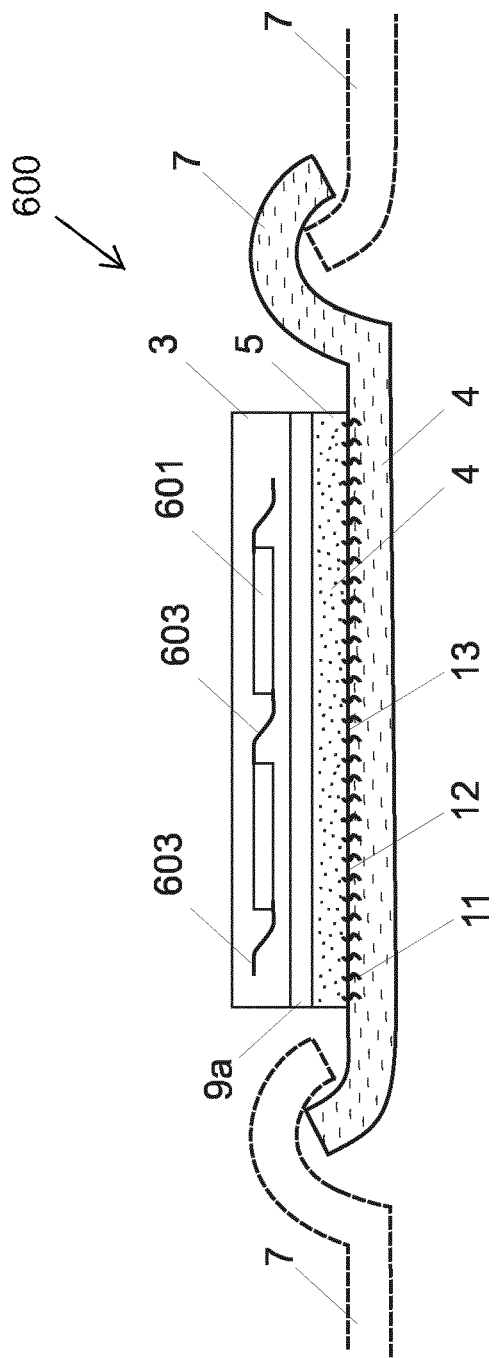
FIG. 6 provides a photovoltaic element according to a further embodiment of the present invention.

FIG. 6 shows a photovoltaic element 600 according to a further embodiment of the present invention. The photovoltaic element 600 has many of the same features as the photovoltaic element 1 shown in FIG. 1. And like features are awarded the same reference numerals.

The photovoltaic element 600 further comprises a plurality of crystalline silicon wafers 601 which are located within the active layer 3. Each successive wafer is electrical connected by means of electrical connectors 603. The wafers might have some limited flexibility.

Various modifications and variations to the described embodiments of the invention will be apparent to those skilled in the art without departing from the scope of the invention as defined in the appended claims. Although the invention has been described in connection with specific preferred embodiments, it should be understood that the invention as claimed should not be unduly limited to such specific embodiment.

The invention claimed is:

1. A method of manufacturing a photovoltaic element, comprising the steps of
providing a flexible photovoltaic laminate;
forming a semi-finished product comprising said flexible photovoltaic laminate with a plurality of hairs extending from a surface of said flexible photovoltaic laminate by gluing the plurality of hairs to the surface of said flexible photovoltaic laminate, wherein the plurality of hairs define an uncovered first surface; and
subsequently fixing a structural substrate on the semi-finished product by moulding the structural substrate directly on the uncovered first surface of said plurality of hairs glued to the surface of the photovoltaic laminate such that the plurality of hairs are embedded into the structural substrate, said plurality of hairs providing improved adhesion between said flexible photovoltaic laminate and the structural substrate.

2. The method of claim 1, wherein the flexible photovoltaic laminate is applied against a profiled, corrugated, or otherwise non-planar surface of a first mould element.

3. The method of claim 2, wherein the photovoltaic laminate is vacuum-sucked into the first mould element against the corrugated surface, causing said flexible photovoltaic laminate to contour to a corrugated profile of the corrugated surface.

4. A photovoltaic element comprising
a semi-finished product, wherein the semi-finished product comprises:
a flexible photovoltaic laminate, comprising a photovoltaic module, an adhesive layer with a first side attached to said photovoltaic module, and a flexible substrate attached at a first side of the flexible substrate to a second side of said adhesive layer, wherein said second side of said adhesive layer is opposite said first side of said adhesive layer; and
a layer which comprises a plurality of hairs glued to a second side of the flexible substrate, wherein said second side of said flexible substrate is opposite said first side of said flexible substrate; and
a rigid structural substrate fixed onto the semi-finished product;
wherein said plurality of hairs extend from said second surface of the flexible substrate and are embedded into said rigid structural substrate to improve adhesion between said semi-finished product and said rigid structural substrate.

5. A photovoltaic element according to claim 4, wherein the photovoltaic element has a corrugated or other non-planar profile.

6. A photovoltaic element according to claim 4, wherein the rigid structural substrate is a composite comprising resin and fibres.

7. A photovoltaic element according to claim 4, wherein said layer is made of felt or felt-like material.

8. A photovoltaic element according to claim 4, wherein the rigid structural substrate is over-moulded, over-injected, or over-infused onto said layer.

\* \* \* \* \*